(12) United States Patent
Kishimoto

(10) Patent No.: US 10,693,104 B2
(45) Date of Patent: Jun. 23, 2020

(54) ORGANIC ELECTROLUMINESCENT DEVICE AND METHOD FOR PRODUCING SAME

(71) Applicant: Sakai Display Products Corporation, Sakai-shi, Osaka (JP)

(72) Inventor: Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 16/076,157

(22) PCT Filed: Dec. 26, 2017

(86) PCT No.: PCT/JP2017/046605
§ 371 (c)(1),
(2) Date: Aug. 7, 2018

(87) PCT Pub. No.: WO2019/130417
PCT Pub. Date: Jul. 4, 2019

(65) Prior Publication Data
US 2019/0363292 A1    Nov. 28, 2019

(51) Int. Cl.
*H01L 51/52*    (2006.01)
*H01L 27/32*    (2006.01)

(52) U.S. Cl.
CPC ...... *H01L 51/5253* (2013.01); *H01L 27/3246* (2013.01); *H01L 2227/323* (2013.01)

(58) Field of Classification Search
None
See application file for complete search history.

(56) References Cited

U.S. PATENT DOCUMENTS

2003/0164674 A1* 9/2003 Imamura ............... H05B 33/04
313/493
2005/0218396 A1    10/2005 Tsuchiya et al.
(Continued)

FOREIGN PATENT DOCUMENTS

JP    2005-100685 A    4/2005
JP    2007-141749 A    6/2007
(Continued)

OTHER PUBLICATIONS

Decision to Grant for related Japanese Application No. 2018-515913 dated Jul. 3, 2018.
(Continued)

*Primary Examiner* — Shaun M Campbell
(74) *Attorney, Agent, or Firm* — Renner, Otto, Boisselle & Sklar, LLP

(57) ABSTRACT

An organic EL device (100A) includes an active region (R1) including a plurality of organic EL elements and includes a peripheral region (R2) located in a region other than the active region. The organic EL device includes an element substrate (1) including a substrate, and the plurality of organic EL elements supported by the substrate; and a thin film encapsulation structure (10A) covering the plurality of organic EL elements. The thin film encapsulation structure includes a first inorganic barrier layer (12), an organic barrier layer (14) in contact with a top surface of the first inorganic barrier layer, and a second inorganic barrier layer (16) in contact with the top surface of the first inorganic barrier layer and a top surface of the organic barrier layer. The peripheral region includes a first protruding structure (22a) including a portion extending along at least one side of the active region, the first protruding structure being supported by the substrate, and also includes an extending portion (12e), of the first inorganic barrier layer, extending onto the first protruding structure, the first protruding struc- (Continued)

ture having a height larger than a thickness of the first inorganic barrier layer.

12 Claims, 8 Drawing Sheets

(56) References Cited

U.S. PATENT DOCUMENTS

| | | | |
|---|---|---|---|
| 2007/0114521 A1 | 5/2007 | Hayashi et al. | |
| 2009/0273589 A1* | 11/2009 | Asano | H01L 27/3246 345/204 |
| 2011/0260180 A1 | 10/2011 | Kuranaga et al. | |
| 2015/0380685 A1* | 12/2015 | Lee | H01L 51/5243 257/40 |
| 2016/0043346 A1 | 2/2016 | Kamiya et al. | |
| 2016/0126495 A1* | 5/2016 | Oka | H01L 51/5246 257/40 |
| 2016/0285045 A1* | 9/2016 | Park | H01L 51/5253 |
| 2017/0352832 A1 | 12/2017 | Okamoto et al. | |
| 2018/0040848 A1 | 2/2018 | Hirase et al. | |

FOREIGN PATENT DOCUMENTS

| | | |
|---|---|---|
| JP | 2008-165251 A | 7/2008 |
| JP | 2010-165612 A | 7/2010 |
| JP | 2011-227369 A | 11/2011 |
| JP | 2015-109285 A | 6/2015 |
| JP | 2015-176717 A | 10/2015 |
| JP | 2015-220001 A | 12/2015 |
| JP | 2015-222664 A | 12/2015 |
| JP | 2016-039120 A | 3/2016 |
| JP | 2017-142999 A | 8/2017 |
| KR | 10-2017-0038565 A | 4/2017 |
| KR | 10-2017-0080224 A | 7/2017 |
| WO | WO 2007/088690 A1 | 8/2007 |
| WO | WO 2014/196137 A1 | 12/2014 |
| WO | WO 2016/098655 A1 | 6/2016 |
| WO | WO 2016/132954 A1 | 8/2016 |

OTHER PUBLICATIONS

PCT International Search Report for related International Application No. PCT/JP2017/046605 dated Feb. 13, 2018.

* cited by examiner (a)

(b)

(a)

(b)

(c)

ORGANIC ELECTROLUMINESCENT DEVICE AND METHOD FOR PRODUCING SAME

TECHNICAL FIELD

The present invention relates to an organic EL device and a method for producing the same.

BACKGROUND ART

Organic EL (Electro-Luminescence) display devices start being put into practical use. One feature of an organic EL display device is being flexible. An organic EL display device includes, in each of pixels, at least one organic EL element (Organic Light Emitting Diode: OLED) and at least one TFT (Thin Film Transistor) controlling an electric current to be supplied to each of the at least one OLED. Hereinafter, an organic EL display device will be referred to as an "OLED display device". Such an OLED display device including a switching element such as a TFT or the like for each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed in order to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to provide a sufficient level of barrier property against water vapor with these thin films. From the point of view of the moisture-resistance reliability of the OLED display device, such a thin film encapsulation structure is typically required to have a WVTR (Water Vapor Transmission Rate) lower than, or equal to, $1 \times 10^{-4}$ g/m$^2$/day.

A thin film encapsulation structure used in OLED display devices commercially available currently includes an organic barrier layer (polymer barrier layer) having a thickness of about 5 μm to about 20 μm. Such a relatively thick organic barrier layer also has a role of flattening a surface of the element substrate.

Patent Documents Nos. 1 and 2 each describe a thin film encapsulation structure including an organic barrier layer formed of resin portions located locally. The thin film encapsulation structure described in Patent Document No. 1 or 2 does not include a thick organic barrier layer. Therefore, use of the thin film encapsulation described in Patent Document No. 1 or 2 is considered to improve the bendability of the OLED display device.

Patent Document No. 1 discloses a thin film encapsulation structure including a first inorganic material layer (first inorganic barrier layer), a first resin member and a second inorganic material layer (second inorganic barrier layer) provided on the element substrate in this order, with the first inorganic material layer being closest to the element substrate. In this thin film encapsulation structure, the first resin member is present locally, more specifically, around a protruding portion of the first inorganic material layer (first inorganic material layer covering a protruding portion). According to Patent Document No. 1, the first resin member is present locally, more specifically, around the protruding portion, which may not be sufficiently covered with the first inorganic material layer. With such a structure, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and vaporized to be mist-like is supplied onto an element substrate maintained at a temperature lower than, or equal to, room temperature. The organic material is condensed and put into liquid drops on the substrate. The organic material in liquid drops moves on the substrate by a capillary action or a surface tension to be present locally, more specifically, at a border between a side surface of the protruding portion of the first inorganic material layer and a surface of the substrate. Then, the organic material is cured to form the first resin member at the border. Patent Document No. 2 also discloses an OLED display device including a similar thin film encapsulation structure.

CITATION LIST

Patent Literature

Patent Document No. 1: WO2014/196137
Patent Document No. 2: Japanese Laid-Open Patent Publication No. 2016-39120

SUMMARY OF INVENTION

Technical Problem

The OLED display device is produced as follows, for example. First, an element substrate including a mother glass substrate and a plurality of OLED display device portions each corresponding to an OLED display device and provided on the mother glass substrate is formed. Next, a thin film encapsulation structure is formed on each of the OLED display device portions included in the element substrate. Then, the resultant assembly is divided into individual OLED display device portions, and a post-process is performed when necessary. As a result, the OLED display devices are produced. From the point of view of the moisture-resistance reliability, it is preferred that an active region of each of the resultant OLED display devices is fully enclosed by a portion where the first inorganic barrier layer and the second inorganic barrier layer are in direct contact with each other.

The present inventor produced experimental OLED display devices by the above-described method. Occasionally, a problem occurred that a sufficient moisture-resistance reliability was not provided.

According to the studies made by the present inventor, in a step of dividing the element substrate, when the inorganic material layer (the first inorganic barrier layer and/or the second inorganic barrier layer) included in the thin film encapsulation structure was present on a cutting line, the inorganic material layer was cracked from the position at which the element substrate was cut. Such a crack occasionally propagated along with time by thermal history or the like and occasionally reached the active region of the OLED display device.

The inorganic material layer included in the thin film encapsulation structure is formed by, for example, mask CVD to cover the active region of the OLED display device. In this step, the inorganic material layer is formed in a region larger than a region where the thin film encapsulation structure is to be formed, in consideration of the level of size precision of the mask CVD device and the alignment error between the mask and the element substrate. If the region where the inorganic material layer is formed is too large, the inorganic material layer is present on the cutting line of the element substrate and thus the above-described problem may occur. In order to improve the mass-productivity of the OLED display device, there is a tendency of increasing the number of OLED display devices to be produced from one mother glass substrate. As a result, the interval between adjacent OLED display device portions is decreased (to, for example, several millimeters), which is likely to cause the above-described problem.

The above-described problem is not limited to being caused to an OLED display device including a thin film encapsulation structure described in Patent Documents Nos. 1 and 2, but is also applied to OLED display devices including a thin film encapsulation structure that includes an organic barrier layer having a thickness exceeding 5 μm. Herein, the problem of the thin film encapsulation structure included in an OLED display device is described, but the thin film encapsulation structure is not limited to being included in an OLED display device but is also used in another organic EL device such as an organic EL illumination device or the like.

The present invention made to solve the above-described problem has an object of providing an organic EL device, including a thin film encapsulation structure, that has an improved moisture-resistance reliability, and a method for producing the same.

Solution to Problem

An organic EL device according to an embodiment of the present invention is an organic EL device including an active region that includes a plurality of organic EL elements and also including a peripheral region located in a region other than the active region. The organic EL device includes an element substrate including a substrate, and the plurality of organic EL elements supported by the substrate; and a thin film encapsulation structure covering the plurality of organic EL elements. The thin film encapsulation structure includes a first inorganic barrier layer, an organic barrier layer in contact with a top surface of the first inorganic barrier layer, and a second inorganic barrier layer in contact with the top surface of the first inorganic barrier layer and a top surface of the organic barrier layer. The peripheral region includes a first protruding structure supported by the substrate, the first protruding structure including a portion extending along at least one side of the active region, and also includes an extending portion, of the first inorganic barrier layer, extending onto the first protruding structure, the first protruding structure having a height larger than a thickness of the first inorganic barrier layer. The thickness of the first inorganic barrier layer is, for example, a thickness of a portion of the first inorganic barrier layer that is in the active region.

In an embodiment, the first protruding structure includes a top portion having a width of 10 μm or shorter in a cross-section perpendicular to a direction in which the first protruding structure extends.

In an embodiment, the first protruding structure has a side surface having a tapering angle of 80 degrees or larger in a cross-section perpendicular to a direction in which the first protruding structure extends.

In an embodiment, the first protruding structure includes a top portion having a width that is less than a half of a sum of the thickness of the first inorganic barrier layer and a thickness of the second inorganic barrier layer in a cross-section perpendicular to a direction in which the first protruding structure extends. The thickness of the first inorganic barrier layer and the thickness of the second inorganic barrier layer are respectively, for example, thicknesses of portions of the first inorganic barrier layer and the second inorganic barrier layer that are formed in the active region.

In an embodiment, the peripheral region includes an extending portion, of the second inorganic barrier layer, extending onto the extending portion of the first inorganic barrier layer.

In an embodiment, the second inorganic barrier layer does not overlap the first protruding structure as seen in a direction normal to the substrate.

In an embodiment, the first protruding structure includes a portion extending along three sides of the active region.

In an embodiment, the element substrate includes a plurality of gate bus lines each connected with any of the plurality of organic EL elements, and a plurality of source bus lines each connected with any of the plurality of organic EL elements. The peripheral region includes a plurality of terminals provided in a region in the vicinity of a certain side of the active region, and a plurality of lead wires connecting each of the plurality of terminals and either one of the plurality of gate bus lines or either one of the plurality of source bus lines to each other. The first protruding structure includes a portion extending along three sides of the active region other than the certain side.

In an embodiment, the organic barrier layer includes a plurality of solid portions distributed discretely. The second inorganic barrier layer is in contact with the top surface of the first inorganic barrier layer and top surfaces of the plurality of solid portions of the organic barrier layer.

In an embodiment, the peripheral region includes a second protruding structure between the active region and the first protruding structure, the second protruding structure extending along at least one side of the active region.

In an embodiment, the first protruding structure includes a plurality of sub structures.

A method for producing an organic EL device according to an embodiment of the present invention includes the steps of preparing an element substrate including a substrate and a plurality of organic EL elements supported by the substrate; and forming a thin film encapsulation structure covering the plurality of organic EL elements. The step of preparing the element substrate includes step a1 of forming a first protruding structure including a portion extending along at least one side of an active region including the plurality of organic EL elements. The step of forming the thin film encapsulation structure includes step A of forming a first inorganic barrier layer on the first protruding structure so as to cover the first protruding structure, the first inorganic barrier layer having a thickness smaller than a height of the first protruding structure, step B of, after the step A, forming an organic barrier layer on the first inorganic barrier layer, and step C of, after the step B, forming a second inorganic barrier layer on the first inorganic barrier layer and the organic barrier layer.

In an embodiment, the step of preparing the element substrate further includes step a2 of forming a bank layer defining each of a plurality of pixels each including either one of the plurality of organic EL elements. The step a1 and the step a2 are performed by patterning the same resin film.

Advantageous Effects of Invention

An embodiment of the present invention provides an organic EL device, including a thin film encapsulation structure, that has an improved moisture-resistance reliability, and a method for producing the same.

BRIEF DESCRIPTION OF DRAWINGS

FIG. 5(a) is a cross-sectional view taken along line 5A-5A' in FIG. 2, FIG. 5(b) is a cross-sectional view taken along line 5B-5B' in FIG. 2, and FIG. 5(c) is a cross-sectional view taken along line 5C-5C' in FIG. 2.

DESCRIPTION OF EMBODIMENTS

Hereinafter, an organic EL device and a method for producing the same according to an embodiment of the present invention will be described with reference to the drawings. In the following, an OLED display device is described as an example of the organic EL device. The embodiments of the present invention are not limited to the embodiments described below as examples.

Figure 1:
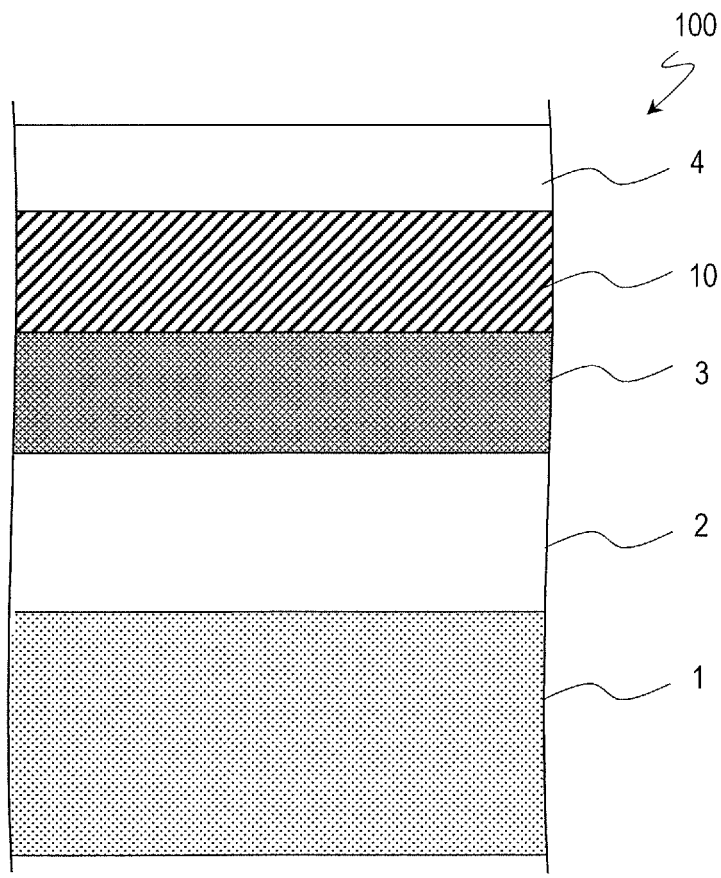
FIG. 1(a) is a schematic partial cross-sectional view of an active region of an OLED display device 100 according to an embodiment of the present invention.
FIG. 1(b) is a partial cross-sectional view of a TFE structure 10 formed on an OLED 3.
Figure 1:
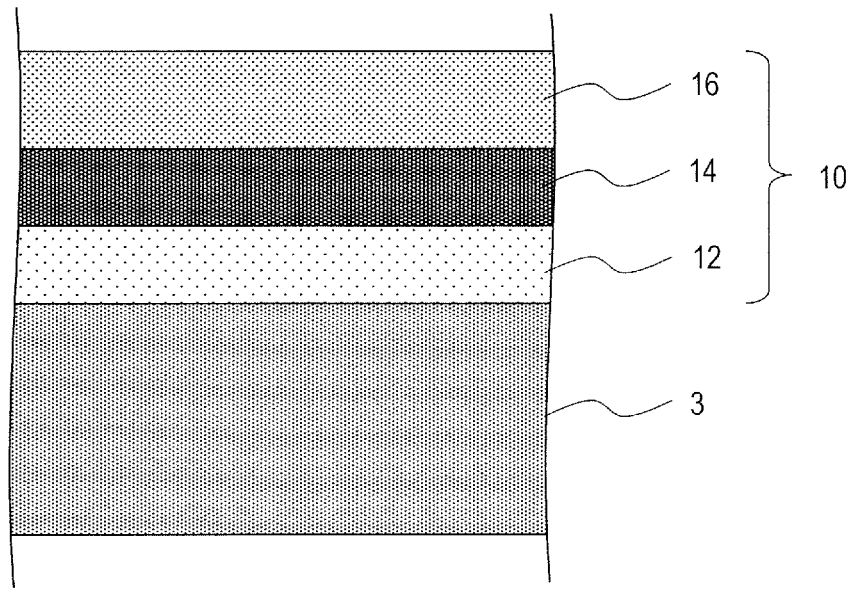

First, with reference to FIG. 1(a) and FIG. 1(b), a basic structure of an OLED display device 100 according to an embodiment of the present invention will be described. FIG. 1(a) is a schematic partial cross-sectional view of an active region of the OLED display device 100 according to an embodiment of the present invention. FIG. 1(b) is a partial cross-sectional view of a TFE structure 10 formed on an OLED 3. An OLED display device 100A according to embodiment 1 and an OLED display device according to embodiment 2 described below each have basically the same structure. Especially, components other than components regarding the TFE structure may be the same as those of the OLED display device 100.

The OLED display device 100 includes a plurality of pixels, and each of the pixels includes at least one organic EL element (OLED). Herein, a structure corresponding to one OLED will be described for the sake of simplicity.

As shown in FIG. 1(a), the OLED display device 100 includes a substrate (for example, a flexible substrate; hereinafter, may be referred to simply as a "substrate") 1, a circuit (back plane) 2 formed on the substrate 1 and including a TFT, the OLED 3 formed on the circuit 2, and the TFE structure 10 formed on the OLED 3. The OLED 3 is, for example, of a top emission type. An uppermost portion of the OLED 3 is, for example, an upper electrode or a cap layer (refractive index adjusting layer). An optional polarizing plate 4 is located on the TFE structure 10. In the following, an example in which the substrate 1 is a flexible substrate will be described.

The substrate 1 is, for example, a polyimide film having a thickness of 15 μm. The circuit 2 including the TFT has a thickness of, for example, 4 μm. The OLED 3 has a thickness of, for example, 1 μm. The TFE structure 10 has a thickness that is, for example, less than, or equal to, 1.5 μm.

FIG. 1(b) is a partial cross-sectional view of the TFE structure 10 formed on the OLED 3. The TFE structure 10 includes a first inorganic barrier layer (e.g., SiN layer) 12, an organic barrier layer (e.g., acrylic resin layer) 14 in contact with a top surface of the first inorganic barrier layer 12, and a second inorganic barrier layer (e.g., SiN layer) 16 in contact with the top surface of the first inorganic barrier layer 12 and a top surface of the organic barrier layer 14. The first inorganic barrier layer 12 is formed immediately on the OLED 3.

The TFE structure 10 is formed so as to protect an active region (see the active region R1 in FIG. 2) of the OLED display device 100. As described above, the TFE structure 10 includes, in at least the active region, the first inorganic barrier layer 12, the organic barrier layer 14 and the second inorganic barrier layer 16 in this order, with the first inorganic barrier layer 12 being closest to the OLED 3.

Embodiment 1

Figure 2:
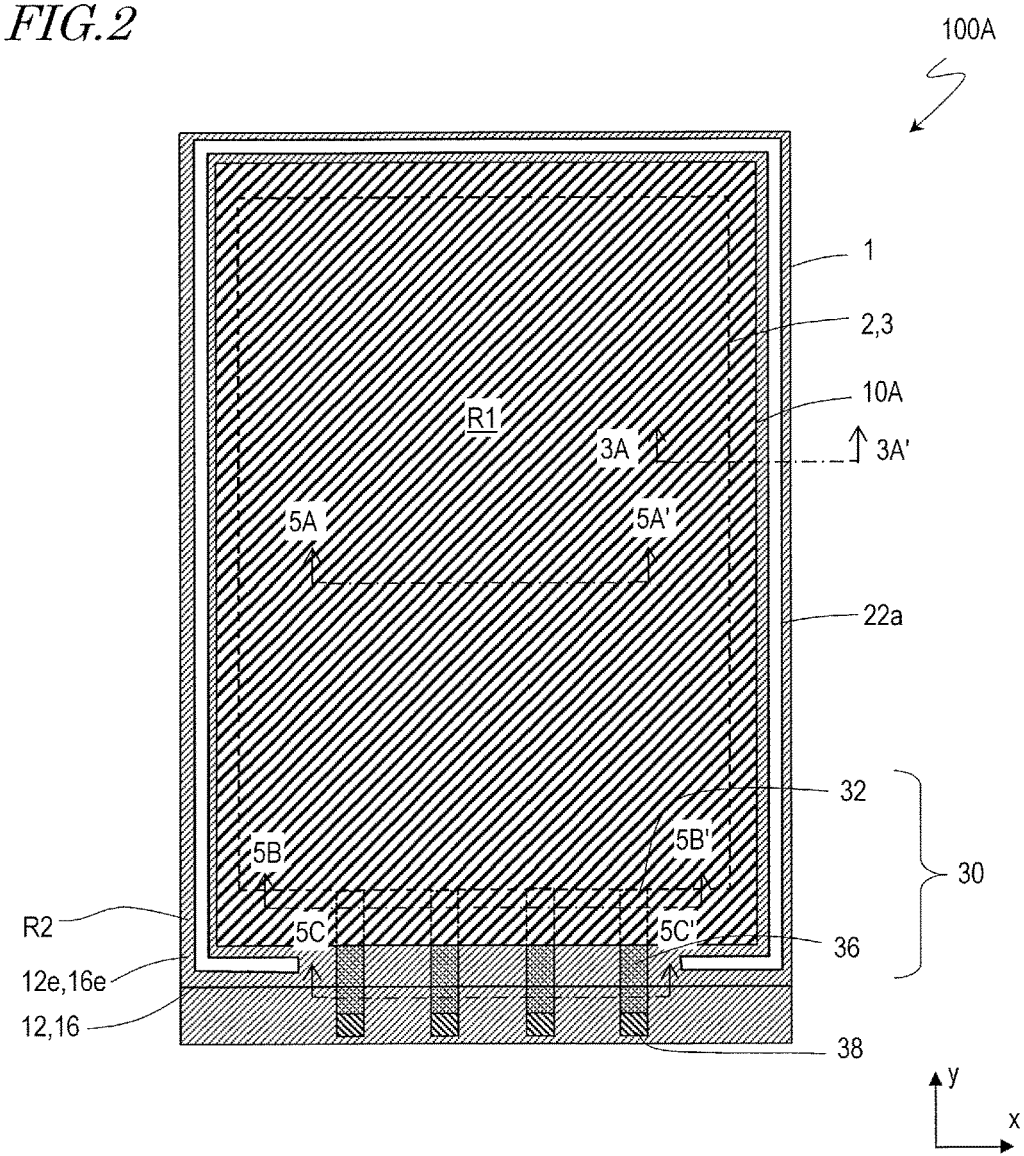
FIG. 2 is a plan view schematically showing a structure of an OLED display device 100A according to embodiment 1 of the present invention.
Figure 3:
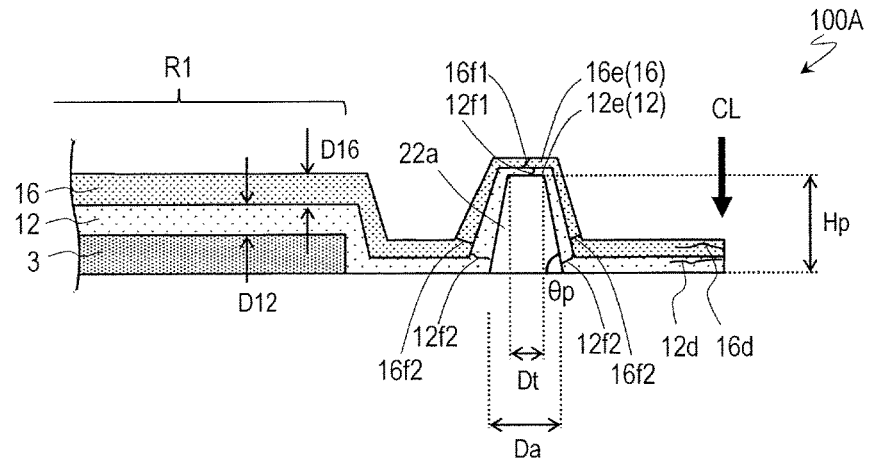
FIG. 3 is a schematic cross-sectional view of the OLED display device 100A taken along line 3A-3A' in FIG. 2.
Figure 4:
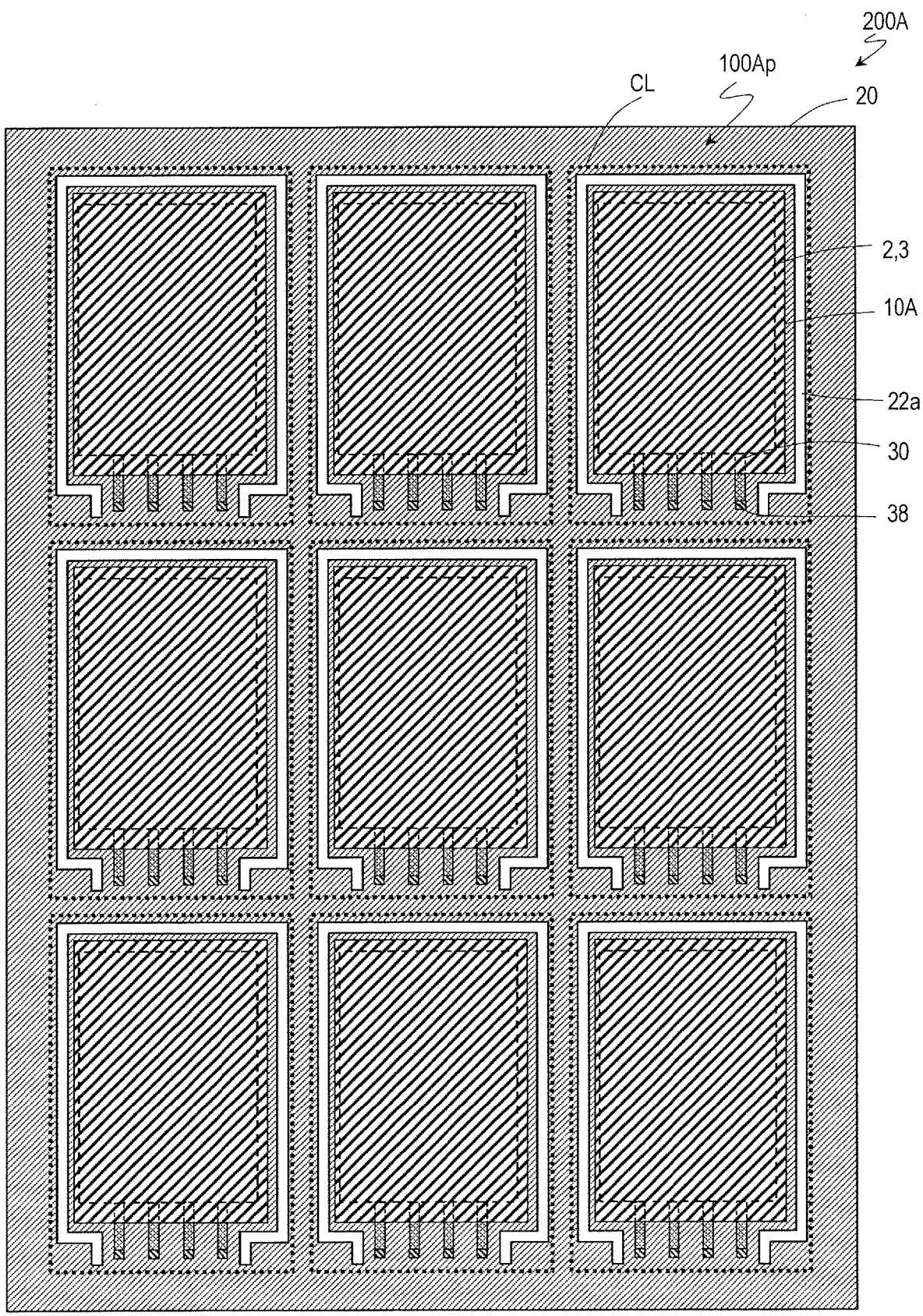
FIG. 4 is a schematic view provided to describe a method for producing the OLED display device 100A, and schematically shows a mother panel 200A usable to form the OLED display device 100A.

With reference to FIG. 2 through FIG. 4, a structure of, and a method for producing, the OLED display device 100A according to embodiment 1 of the present invention will be described.

FIG. 2 is a plan view schematically showing the OLED display device 100A according to an embodiment of the present invention. FIG. 3 is a cross-sectional view schematically showing the OLED display device 100A, and is a cross-sectional view taken along line 3A-3A' in FIG. 2.

As shown in FIG. 2, the OLED display device 100A includes the flexible substrate 1, the circuit (back plane) 2 formed on the flexible substrate 1, a plurality of the OLEDs 3 formed on the circuit 2, and a TFE structure 10A formed on the OLEDs 3. A layer including the plurality of OLEDs 3 may be referred to as an "OLED layer 3". The circuit 2 and the OLED layer 3 may share a part of components. The optional polarizing plate (see reference numeral 4 in FIG. 1) may further be located on the TFE structure 10A. In addition, for example, a layer having a touch panel function may be located between the TFE structure 10A and the polarizing plate. Namely, the OLED display device 100 may be altered to a display device including an on-cell type touch panel.

The circuit 2 includes a plurality of TFTs (not shown), and a plurality of gate bus lines (not shown) and a plurality of source bus lines (not shown) each connected with any of the plurality of TFTs (not shown). The circuit 2 may be a known circuit that drives the plurality of OLEDs 3. The plurality of OLEDs 3 are each connected with either one of the plurality of TFTs included in the circuit 2. The OLEDs 3 may be known OLEDs.

The OLED display device 100A further includes a plurality of terminals 38 located in a peripheral region R2 outer to the active region R1 (region enclosed by the dashed line in FIG. 2), where the plurality of OLEDs 3 are located, and also includes a plurality of lead wires 30 connecting each of the plurality of terminals 38 and either one of the plurality of gate bus lines or either one of the plurality of source bus lines to each other. The TFE structure 10A is formed on the plurality of OLEDs 3 and on a portion of the plurality of lead wires 30 that is close to the active region R1. Namely, the TFE structure 10A covers the entirety of the active region R1 and is also selectively formed on the portion of the plurality of lead wires 30 that is close to the active region R1. Neither a portion of the plurality of lead wires 30 that are closer to the terminals 38, nor the terminals 38, are covered with the TFE structure 10A.

Hereinafter, an example in which the lead wires 30 and the terminals 38 are integrally formed in the same conductive layer will be described. Alternatively, the lead wires 30 and the terminals 38 may be formed in different conductive layers (encompassing stack structures).

As shown in FIG. 2 and FIG. 3, the peripheral region R2 of the OLED display device 100A includes a protruding structure 22a extending along at least one side of the active region R1 and an extending portion 12e, of the first inorganic barrier layer 12, extending onto the protruding structure 22a. The protruding structure 22a has a height Hp larger than a thickness D12 of the first inorganic barrier layer 12. The "thickness D12 of the first inorganic barrier layer 12" refers to a thickness of a portion of the first inorganic barrier layer 12 that is formed in the active region R1.

With reference to FIG. 4, a method for producing the OLED display device 100A will be described. FIG. 4 schematically shows a mother panel 200A usable to form the OLED display device 100A.

As shown in FIG. 4, the mother panel 200A includes an element substrate 20 formed by use of a mother substrate (e.g., G4.5 (730 mm×920 mm)) and the thin film encapsulation structures 10A formed on the element substrate 20. The element substrate 20 includes a plurality of OLED display device portions 100Ap, each of which is to be the OLED display device 100A. The thin film encapsulation structures 10A are each formed so as to protect the active region R1 of the corresponding OLED display device portion 100Ap. The mother panel 200A is divided into individual OLED display device portions 100Ap along a cutting line CL, and then a post-process is performed when necessary. As a result, the OLED display devices 100A are produced.

The first inorganic barrier layer 12 and the second inorganic barrier layer 16 are formed by, for example, plasma CVD using a mask, selectively only in a predetermined region so as to cover the active region R1 of each of the OLED display device portions 100Ap. It is preferred that the active region R1 of each of the OLED display device portions 100Ap is fully enclosed by a portion where the first inorganic barrier layer 12 and the second inorganic barrier layer 16 are in direct contact with each other (hereinafter, such a portion will be referred to as an "inorganic barrier layer joint portion"). As long as the active region R1 is fully enclosed by the inorganic barrier layer joint portion, the first inorganic barrier layer 12 and the second inorganic barrier layer 16 may have any shape. For example, the shape of the second inorganic barrier layer 16 may be the same as the shape of the first inorganic barrier layer 12 (outer perimeters thereof may match each other). The second inorganic barrier layer 16 may be formed so as to cover the entirety of the first inorganic barrier layer 12. The first inorganic barrier layer 12 may be formed so as to cover the entirety of the second inorganic barrier layer 16. An external shape of the TFE structure 10A is defined by, for example, the inorganic barrier layer joint portion formed by the first inorganic barrier layer 12 and the second inorganic barrier layer 16.

In the plan views of FIG. 2 and FIG. 4, only the region where each of the TFE structure 10A is to be formed is shown as the TFE structure 10A. The region where the TFE structure 10A is to be formed is a region that covers at least the active region R1 and includes the inorganic barrier layer joint portion. In addition, the region where the TFE structure 10A is to be formed is inner to the cutting line CL. A reason for this is that if the first inorganic barrier layer 12 and/or the second inorganic barrier layer 16 is present on the cutting line CL, the number of layers to be cut in the step of cutting the element substrate 20 is increased, and thus the production cost may be raised. The regions where the TFE structures 10A are to be formed shown in FIG. 2 and FIG. 4 correspond to, for example, the shape of a CVD mask used to form the first inorganic barrier layer 12 and/or the second inorganic barrier layer 16.

However, in actuality, as shown in the cross-sectional view of FIG. 3, the region where the first inorganic barrier layer 12 and/or the second inorganic barrier layer 16 is formed may occasionally be larger than the region where the TFE structure 10A is to be formed, due to, for example, the level of size precision of the mask CVD device. In addition, the first inorganic barrier layer 12 may occasionally be formed in a region larger than the region where the thin film encapsulation structure 10A is to be formed, in consideration of the alignment error between the mask for the first inorganic barrier layer 12 and the element substrate 20. From the point of view of improving the mass-productivity of the OLED display device, it is preferred that the distance between adjacent OLED display device portions 100Ap included in the element substrate 20 is small (e.g., several millimeters (e.g., 3 mm)). In such cases, the first inorganic barrier layer 12 and/or the second inorganic barrier layer 16 may be present on the cutting line CL. In this specification, a portion of the first inorganic barrier layer 12 that is formed in a region other than the region where the TFE structure 10A is to be formed may be referred to as the "extending portion 12e". The same is applicable to the second inorganic barrier layer 16. A portion of the second inorganic barrier layer 16 that is formed in a region other than the region where the TFE structure 10A is to be formed may be referred to as an "extending portion 16e".

As shown in FIG. 3, in the resultant OLED display device 100A, a crack 12d may be generated in the first inorganic barrier layer 12 from the cut position (cutting line CL). The crack 12d propagates along with time due to thermal history or the like. If the protruding structure 22a is not present, the crack 12d may reach the active region R1 via the first inorganic barrier layer 12. However, the OLED display device 100A includes the protruding structure 22a formed below the first inorganic barrier layer 12, and therefore, suppresses the crack 12d from reaching the active region R1. The moisture-resistance reliability of the OLED display device 100A is improved.

As shown in FIG. 3, a crack 12f2 is likely to be formed in the first inorganic barrier layer 12 at the border between a flat surface on which the protruding structure 22a is formed and a side surface of the protruding structure 22a. A reason for this is that a portion having a low density (low film density) is formed in an area where an SiN film growing from the flat surface and an SiN film growing from the side surface impinge on each other. In an extreme case, such a defect may become a crack. Similarly, a defect 12f1 is likely to be formed on a top surface of the protruding structure 22a. The defects 12f1 and 12f2 are formed linearly in a direction in which the protruding structure 22a extends. If the crack 12d generated in the first inorganic barrier layer 12 in the dividing step propagates toward the active region R1, a tip of the crack 12d reaches the linear defect 12f1 or 12f2 formed along the direction in which the protruding structure 22a extends. When this occurs, the stress at the tip of the crack 12d is released, and the crack 12d is prevented from propagating beyond the linear defect 12f1 or 12f2.

For example, in the case where a top portion of the protruding structure 22a has a small width Dt in a cross-section perpendicular to the direction in which the protruding structure 22 extends (e.g., the cross-section shown in FIG. 3), the first inorganic barrier layer 12 (extending portion 12e) formed on the top portion of the protruding structure 22 is thin and/or has the defect 12f1. Therefore, the crack 12d is prevented from propagating. Alternatively, in the case where the side surface of the protruding structure 22a has a large tapering angle θp in the cross-section perpendicular to the direction in which the protruding structure 22 extends (e.g., the cross-section shown in FIG. 3), the defect 12f2 is generated in the first inorganic barrier layer 12 (extending portion 12e) formed on the side surface of the protruding structure 22. Therefore, the first inorganic barrier layer 12 suppresses the crack 12d from propagating.

In the example shown here, the second inorganic barrier layer 16 is also formed on the cutting line CL. Therefore, as shown in FIG. 3, a crack 16d may also be formed in the second inorganic barrier layer 16 from the cut position (cutting line CL) in the resultant OLED display device 100A. The second inorganic barrier layer 16 includes an extending portion 16e formed on the extending portion 12e of the first inorganic barrier layer 12. The second inorganic barrier layer 16 reflects stepped portions formed by the defects 12f1 and 12f2 in the first inorganic barrier layer 12, which is an underlying layer for the second inorganic barrier layer 16. Therefore, the extending portion 16e of the second inorganic barrier layer 16 is thin and/or includes defects 16f1 and 16f2. As a result, the second inorganic barrier layer 16 suppresses the crack 16d from reaching the active region R1.

Herein, an example in which the first inorganic barrier layer 12 and the second inorganic barrier layer 16 are selectively formed in only predetermined regions so as to cover the active regions R1 is described. This embodiment is not limited to this. The first inorganic barrier layer 12 and/or the second inorganic barrier layer 16 may be formed on the entirety of a surface of the element substrate 20 formed by use of the mother substrate. In this case also, the provision of the protruding structure 22a improves the moisture-resistance reliability of the resultant OLED display devices as described above.

It is preferred that the shape of the cross-section of the protruding structure 22a perpendicular to the direction in which the protruding structure 22a extends is adjusted such that the thickness of the first inorganic barrier layer 12 (extending portion 12e) extending onto the protruding structure 22a is smaller than the thickness D12 of the first inorganic barrier layer 12 formed in the active region R1. The shape of the above-described cross-section of the protruding structure 22a may be adjusted such that the defect 12f1 is generated in the first inorganic barrier layer 12 (extending portion 12e) formed on the top surface of the protruding structure 22a. For example, the width Dt of the top portion of the protruding structure 22a in the cross-section perpendicular to the direction in which the protruding structure 22a extends is preferably 10 μm or shorter, and is more preferably 5 μm or shorter. The shape of the above-described cross-section of the protruding structure 22a may be adjusted such that the defect 12f2 is generated in the first inorganic barrier layer 12. For example, it is preferred that the tapering angle θp (90 degrees or smaller) of the side surface of the protruding structure 22a in the cross-section perpendicular to the direction in which the protruding structure 22a extends is 80 degrees or larger. The cross-section of the protruding structure 22a perpendicular to the direction in which the protruding structure 22a extends is ideally triangular, and is preferably of a shape close to a triangle. The above-described cross-section is, for example, a trapezoid with a top portion having a small width. The above-described cross-section is not limited to having a shape shown in the figure. For example, the top portion may have rounded edges. The top portion may include a curved line.

In the case where, as in the example shown in the figure, the first inorganic barrier layer 12 and the second inorganic barrier layer 16 are formed on the protruding structure 22a, it is preferred that, for example, the height Hp of the protruding structure 22a is at least 1.2 times a sum of the thickness D12 of the first inorganic barrier layer 12 and a thickness D16 of the second inorganic barrier layer 16 (i.e., (D12+D16). It is preferred that the width Dt of the top portion of the protruding structure 22a in the cross-section perpendicular to the direction in which the protruding structure 22a extends is less than a half of the sum of the thickness D12 of the first inorganic barrier layer and the thickness D16 of the second inorganic barrier layer 16 (i.e., (D12+D16). Herein, the thickness D12 of the first inorganic barrier layer 12 and the thickness D16 of the second inorganic barrier layer 16 are respectively thicknesses of portions of the first inorganic barrier layer 12 and the second inorganic barrier layer 16 that are formed in the active region R1. The first inorganic barrier layer 12 and the second inorganic barrier layer 16 are each an SiN layer (e.g., $Si_3N_4$ layer) having a thickness of, for example, 400 nm. The height Hp of the protruding structure 22a is, for example, 1 μm. The width Dt of the top portion of the protruding structure 22a is, for example, 300 nm.

A width Da of a bottom portion of the protruding structure 22a in the cross-section perpendicular to the direction in which the protruding structure 22a extends is, for example, 10 μm or shorter. In this case, provision of the protruding structure 22a does not significantly influence the reduction of the width of the frame portion of the OLED display device 100A.

The protruding structure 22a is formed of a photosensitive resin by a photolithography process, for example. The protruding structure 22a may be formed in, for example, a step of forming a bank layer (not shown) (also referred to as a "PDL (Pixel Defining Layer)") defining each of the plurality of pixels. Namely, the protruding structure 22a and the bank layer may be formed by patterning the same resin film. The bank layer is formed, for example, between a lower electrode acting as an anode electrode of the OLED 3 and an organic layer (organic light emitting layer) formed on the lower electrode. The bank layer has a thickness of several micrometers (e.g. 1 µm to 2 µm). Therefore, the height of the protruding structure 22a may be equal to the height of the bank layer. Needless to say, a photolithography process using a multi-gray scale mask (half-tone mask or gray-tone mask) may be used to make the height of the protruding structure 22a different from the height of the bank layer. Alternatively, the protruding structure 22a may be formed in any of steps of forming the circuit (back plane) 2. For example, the protruding structure 22a may be formed of the resin film used to form a flattening layer, which is an underlying layer for the lower electrode of the OLED 3. Needless to say, the protruding structure 22a may be formed in a step different from the steps of forming the circuit (back plane) 2.

In the case where the organic light emitting layer of the OLED 3 is formed by mask deposition, the protruding structure 22a may also act as a spacer used to form a desired gap between the deposition mask and a surface of the element substrate. Alternatively, the protruding structure 22a may also act as a spacer used to support a touch sensor layer or a substrate (protective layer) located on the TFE structure 10A. In the case where the protruding structure 22a acts as a spacer, the width Dt of the top portion of the protruding structure 22a in the cross-section perpendicular to the direction in which the protruding structure 22 extends is preferably 5 µm or longer, and is more preferably 10 µm or longer. In the case where the width Dt of the top portion of the protruding structure 22a is in the above-described range, no defect may be generated in the first inorganic barrier layer 12 formed on the top surface of the protruding structure 22a. However, for example, the tapering angle θp of the side surface of the protruding structure 22a may be made 80 degrees or larger, so that the defect 12f2 is generated in the first inorganic barrier layer 12 formed on the side surface of the protruding structure 22a.

As shown in FIG. 2, the protruding structure 22a includes a portion extending along three sides, among the four sides of the active region R1, other than the side along which the plurality of terminals 38 and the plurality of lead wires 30 are provided (other than the bottom side in FIG. 2 among x-axis-direction sides). For, for example, a middle- or small-sized OLED display device, it is required to decrease the width of three peripheral regions, among four, i.e., top, bottom, left and right, peripheral regions outer to the active regions R1, other than one peripheral region in which the terminals of the lines are drawn. Therefore, the inorganic barrier layer is likely to be formed on the cutting line CL in the three peripheral regions as described above. Nonetheless, provision of the protruding structure 22a in these three peripheral regions improves the moisture-resistance reliability. By contrast, in the peripheral region in which the terminals of the lines are drawn, the width of the frame portion is not required to be decreased significantly. Therefore, it is easy to form the inorganic barrier layer so as not to overlap the cutting line CL. This allows the protruding structure 22a to be omitted. As shown in FIG. 2, the protruding structure 22a may be provided along the four sides of the active region R1 except for a portion where the plurality of terminals 38 are provided. It is preferred that the protruding structure 22a is provided so as to interrupt a line (e.g., straight line) connecting the cutting line CL and an outer perimeter of the active region R1 to each other, except for the portion where the plurality of terminals 38 are provided.

The protruding structure is not limited to having a planar shape shown in the figure as an example. The protruding structure may extend along two sides, among the four sides of the active region R1, other than two sides along which the plurality of terminals are provided. For example, a large-sized OLED display device may have a structure in which terminals of the lines are drawn in two peripheral regions facing each other (top and bottom peripheral regions or left and right peripheral regions) among the four, i.e., top, bottom, left and right, peripheral regions outer to the active region R1. The protruding structure does not need to be formed as a single structure, and may include a plurality of sub structures. It is sufficient that the plurality of sub structures, as a whole, interrupt between the cutting line CL and the outer perimeter of the active region R1. Examples of the positional arrangement and the planar shape of the protruding structure will be described below.

Figure 5:
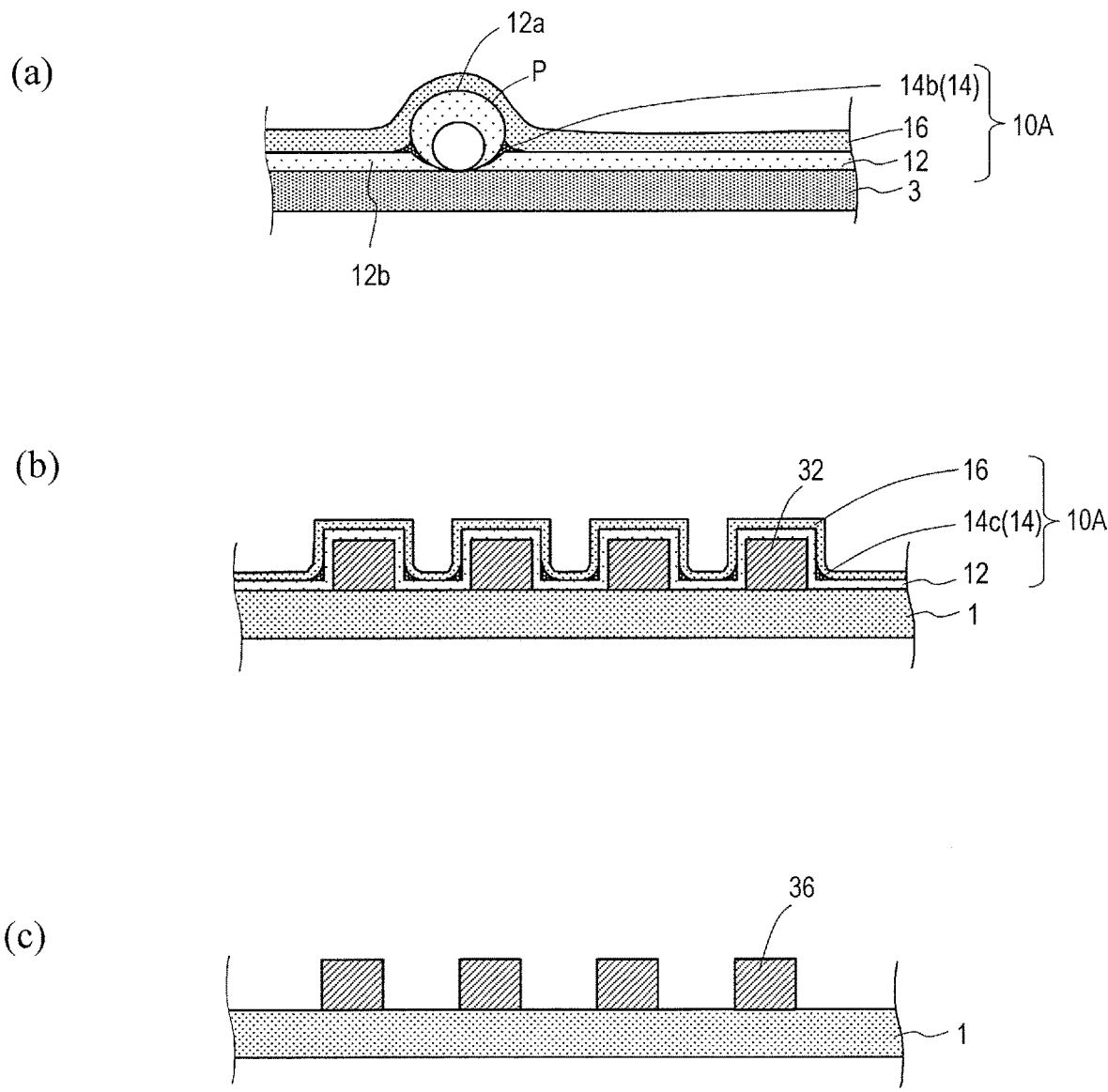
FIG. 5(a) through FIG. 5(c) are each a schematic cross-sectional view of the OLED display device 100A.

Now, with reference to FIG. 5(a) through FIG. 5(c), the TFE structure 10A of the OLED display device 100A will be described. FIG. 5(a) is a cross-sectional view taken along line 5A-5A' in FIG. 2, FIG. 5(b) is a cross-sectional view taken along line 5B-5B' in FIG. 2, and FIG. 5(c) is a cross-sectional view taken along line 5C-5C' in FIG. 2.

As shown in FIG. 5(a) and FIG. 5(b), the TFE structure 10A includes the first inorganic barrier layer 12 formed on the OLED 3, the organic barrier layer 14, and the second inorganic barrier layer 16 in contact with the first inorganic barrier layer 12 and the organic barrier layer 14. In this example, the organic barrier layer 14 includes a plurality of solid portions in contact with the top surface of the first inorganic barrier layer 12 and distributed discretely. The second inorganic barrier layer 16 is in contact with the top surface of the first inorganic barrier layer 12 and top surfaces of the plurality of solid portions of the organic barrier layer 14. The organic barrier layer is not present as a film covering the entirety of the active region, but has openings. Portions of the organic barrier layer 14 where an organic film is actually present, namely, portions except for the openings, will be referred to as "solid portions". The "openings" (may also be referred to as "non-solid portions") do not need to be enclosed by the solid portions and may include a cutout portion and the like. In the openings, the first inorganic barrier layer 12 and the second inorganic barrier layer 16 are in direct contact with each other. The openings of the organic barrier layer 14 include at least an opening formed so as to enclose the active region R1, and the active region R1 is fully enclosed by the portion in which the first inorganic barrier layer 12 and the second inorganic barrier layer 16 are in direct contact with each other ("inorganic barrier layer joint portion").

The first inorganic barrier layer 12 and the second inorganic barrier layer 16 are each, for example, an SiN layer having a thickness of, for example, 400 nm. The organic barrier layer 14 is, for example, an acrylic resin layer having a thickness less than 100 nm. The first inorganic barrier layer 12 and the second inorganic barrier layer 16 each have a thickness of 200 nm or greater and 1000 nm or less independently. The thickness of the organic barrier layer 14 is 50 nm or greater and less than 200 nm. The thickness of the TFE structure 10A is preferably 400 nm or greater and less than 2 µm, and is more preferably 400 nm or greater and less than 1.5 µm.

As described above, the first inorganic barrier layer 12 and the second inorganic barrier layer 16 are selectively formed by, for example, plasma CVD using a mask, in a predetermined region so as to cover the active region R1. In general, a surface of a layer formed by a thin film deposition method (e.g., CVD, sputtering, vacuum vapor deposition) reflects a stepped portion of an underlying layer. The organic barrier layer (solid portion) 14 is formed only around a protruding portion of the surface of the first inorganic barrier layer 12. The first inorganic barrier layer 12 is formed on the protruding structure 22a so as to cover the protruding structure 22a. The thickness of the first inorganic barrier layer 12 is smaller than the height of the protruding structure 22a.

The organic barrier layer 14 may be formed by the method described in, for example, Patent Document No. 1 or 2. For example, a vapor-like or mist-like organic material (e.g., acrylic monomer) is supplied onto an element substrate maintained at a temperature lower than, or equal to, room temperature in the chamber, and is condensed on the element substrate. The organic material put into a liquid state is located locally, more specifically, at the border between a side surface of the protruding portion and the flat portion of the first inorganic barrier layer 12 by a capillary action or a surface tension of the organic material. Then, the organic material is irradiated with, for example, ultraviolet rays to form the solid portion of the organic barrier layer (e.g., acrylic resin layer) 14 at the border around the protruding portion. The organic harrier layer 14 formed by this method includes substantially no solid portion on the flat portion. Regarding the method for forming the organic barrier layer, the disclosures of Patent Documents Nos. 1 and 2 are incorporated herein by reference.

In the case where, as in the example shown in FIG. 3, the second inorganic barrier layer 16 is formed on the protruding structure 22a, it is preferred that the organic barrier layer 14 is not formed on the first inorganic barrier layer 12 (extending portion 12e) formed on the protruding structure 22a. If the organic barrier layer 14 is formed so as to fill the defect 12f1 or 12f2 of the first inorganic barrier layer 12, the stepped portion caused by the defect 12f1 or 12f2 of the first inorganic barrier layer 12 is not reflected by the second inorganic barrier layer 16. In this case, the defect 16f1 or 16f2 is not formed in the second inorganic barrier layer 16, and thus the crack 16d may not be suppressed from reaching the active region R1. Therefore, it is preferred that, for example, any one of the following methods is combined with the method described in Patent Document No. 1 or 2 to prevent the organic barrier layer 14 from being formed on the first inorganic barrier layer 12 (extending portion 12e) formed on the top surface and the side surface of the protruding structure 22a. Any two or more of the methods described below may be combined.

Note that, even if the crack generated in the second inorganic barrier layer 16 reaches the active region R1, the possibility that the moisture-resistance reliability of the OLED display device is declined is low as long as the active region R1 is sufficiently covered with the first inorganic barrier layer 12. The influence exerted on the moisture-resistance reliability by the crack generated in the second inorganic barrier layer 16 reaching the active region R1 is smaller than the influence exerted on the moisture-resistance reliability by the crack generated in the first inorganic barrier layer 12 reaching the active region R1. Therefore, it is optional and may be omitted to prevent the organic barrier layer 14 from being formed on the first inorganic barrier layer 12 formed on the top surface and the side surface of the protruding structure 22a by any of the following methods. The following methods are usable to completely prevent the organic barrier layer 14 from being formed on the first inorganic barrier layer 12 formed on the top surface and the side surface of the protruding structure 22a, and is also usable to partially prevent the organic barrier layer 14 from being formed (e.g., to prevent the organic barrier layer 14 having at least a certain thickness from being formed).

For example, after a photocurable resin layer is formed by the method described in Patent Document No. 1 or 2, a step of partially removing a photocurable resin layer by a dry process may be performed. The expression "remove an organic material by a dry process" indicates removing an organic material by ashing or by a dry process other than ashing (e.g., by sputtering). The organic material is removed from the surface. The expression "remove an organic material by a dry process" encompasses removing the organic material entirely and removing the organic material partially (e.g., from the surface to a certain depth). The "dry process" refers to a process that is not a wet process using a liquid such as a release liquid, a solvent or the like. Ashing may be performed in, for example, an atmosphere containing at least one of $N_2O$, $O_2$ and $O_3$. Ashing is roughly classified into plasma ashing (or corona discharge) using plasma generated by treating any one of the above-described types of atmospheric gas at a high frequency, and photo-excited ashing of irradiating atmospheric gas with light such as ultraviolet rays or the like. Ashing may be performed by use of, for example, a known plasma ashing device, a known ashing device using corona discharge, a known photo-excited ashing device, a known UV ozone ashing device or the like. In the case where an SiN film is formed by CVD as each of the first inorganic barrier layer 12 and the second inorganic barrier layer 16, $N_2O$ is used as material gas. Therefore, use of $N_2O$ for ashing provides an advantage of simplifying the ashing device.

Alternatively, selective exposure such as mask exposure or the like may be performed at the time of curing the photocurable resin. An opening of the organic barrier layer 14 is formed in a region corresponding to a light-blocking portion of the photomask. Therefore, for example, the photocurable resin layer may be exposed to light via a photomask including a light-blocking portion in a region overlapping the protruding structure 22a as seen in a direction normal to the substrate. In this manner, the organic barrier layer 14 having an opening in the region overlapping the protruding structure 22a is provided.

At the time of curing the photocurable resin, a predetermined region of the photocurable resin may be irradiated with a laser beam having a wavelength of 400 nm or shorter, so that the selective exposure is performed. A coherent laser beam emitted from, for example, a semiconductor laser device is used. Therefore, the light beam travels highly straight, and thus the selective exposure is realized with no need of a mask being put into close contact with the element substrate.

Alternatively, infrared rays may be selectively directed toward a specific region, so that the photocurable resin layer is not formed in the specific region. The step of forming the organic barrier layer 14 may include step A of forming a liquid film of the photocurable resin on the substrate; step B of selectively directing, for example, infrared rays toward a first region overlapping the protruding structure 22a to vaporize the photocurable resin in the first region; and step C of, after step B, directing light to which the photocurable resin is sensitive (e.g., ultraviolet rays) toward a second region, including the first region, on the substrate (e.g., toward the entire surface of the substrate), thus to cure the photocurable resin in the second region, and as a result, forming the photocurable resin layer. It is preferred that visible light to be directed instead of, or together with, the infrared rays has a wavelength exceeding 550 nm. The protruding structure 22a may be formed of a material having a large heat capacity.

The surface (e.g., the top portion and the side surface) of the protruding structure 22a may be liquid-repelling against a photocurable resin. For example, a silane coupling agent and a photolithography process may be used to modify a specific region of the surface of the protruding structure 22a to be hydrophobic. Alternatively, the protruding structure 22a may be formed of a resin material that is liquid-repelling against a photocurable resin.

FIG. 5(a) is a cross-sectional view taken along line 5A-5A' in FIG. 2, and shows a portion including a particle P. The particle P is a microscopic dust particle generated during the production of the OLED display device, and is, for example, a microscopic piece of broken glass, a metal particle or an organic particle. Such a particle P is especially easily generated in the case where mask deposition is used.

As shown in FIG. 5(a), the organic barrier layer (solid portions) 14 includes a portion 14b formed around the particle P. A reason for this is that an acrylic monomer supplied after the first inorganic barrier layer 12 is formed is condensed and present locally, more specifically, around a surface of a first inorganic barrier layer 12a on the particle P (the surface has a tapering angle larger than 90 degrees). The organic barrier layer 14 includes the opening (non-solid portion) on the flat portion of the first inorganic barrier layer 12.

Figure 6:
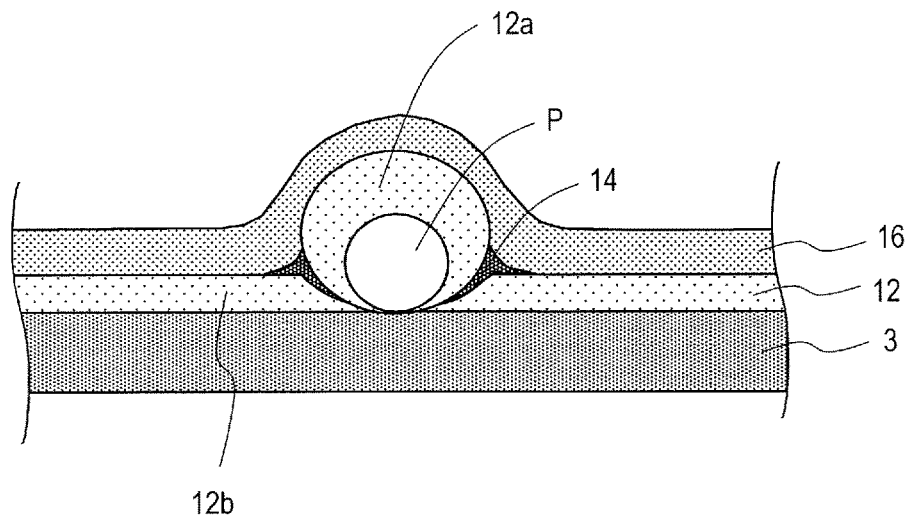
FIG. 6(a) is an enlarged view of a portion including a particle P shown in FIG. 5(a)
FIG. 6(b) is a schematic plan view showing the size relationship among the particle P, a first inorganic barrier layer (SiN layer) covering the particle P, and an organic barrier layer.
FIG. 6(c) is a schematic cross-sectional view of the first inorganic barrier layer covering the particle P.
Figure 6:
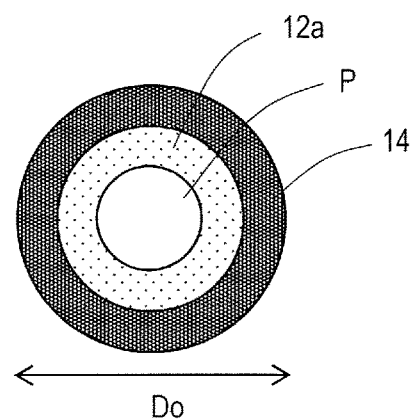
Figure 6:
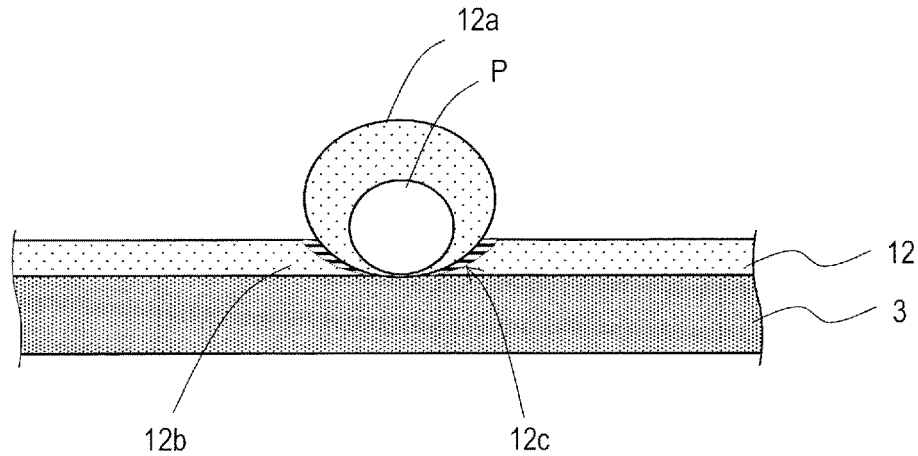

Now, with reference to FIG. 6(a) through FIG. 6(c), a structure of the portion including the particle P will be described. FIG. 6(a) is an enlarged view of the portion including the particle P shown in FIG. 5(a). FIG. 6(b) is a schematic plan view showing the size relationship among the particle P, the first inorganic barrier layer (SiN layer) 12 covering the particle P and the organic barrier layer 14. FIG. 6(c) is a schematic cross-sectional view of the first inorganic barrier layer 12 covering the particle P.

As shown in FIG. 6(c), in the case where the particle P (having a diameter that is, for example, longer than, or equal to, 1 μm) is present, a defect (crack) 12c may be formed in the first inorganic barrier layer. This is considered to be caused by impingement of the SiN layer 12a growing from a surface of the particle P and an SiN layer 12b growing from a flat portion of a surface of the OLED 3. The defect 12c is a portion having a low density (low film density), and in an extreme case, may become the crack 12c. In the case where the crack 12c like this is present, the level of barrier property of the TFE structure 10A is decreased.

In the TFE structure 10A of the OLED display device 100A, as shown in FIG. 6(a), the organic barrier layer 14 is formed to fill the defect 12c of the first inorganic barrier layer 12, and a surface of the organic barrier layer 14 couples a surface of the first inorganic barrier layer 12a on the particle P and a surface of the first inorganic barrier layer 12b on the flat portion of the OLED 3 to each other continuously and smoothly. The organic barrier layer 14, which is formed by curing a photocurable resin in a liquid state as described below, has a recessed surface by a surface tension. In this state, the photocurable resin exhibits a high level of wettability to the first inorganic barrier layer 12. If the level of wettability of the photocurable resin to the first inorganic barrier layer 12 is low, the surface of the organic barrier layer 14 may protrude. The organic barrier layer 14 may also be formed with a small thickness on the first inorganic barrier layer 12a on the particle P.

The organic barrier layer (solid portion) 14 having the recessed surface connects the surface of the first inorganic barrier layer 12a on the particle P and the surface of the first inorganic barrier layer 12b on the flat portion to each other continuously and smoothly. Therefore, the second inorganic barrier layer 16 formed thereon is a fine film with no defect. As can be seen, even if the particle P is present, the organic barrier layer 14 keeps high the level of barrier property of the TFE structure 10A.

As shown in FIG. 6(b), the organic barrier layer 14 (solid portion) is formed in a ring shape around the particle P. Where the particle P has a diameter (equivalent circle diameter) of about 1 μm as seen in a direction normal to the substrate, the ring-shaped solid portion has a diameter $D_O$ (equivalent circle diameter) that is, for example, longer than, or equal to, 2 μm.

In this example, the organic barrier layer 14 is formed only in a discontinuous portion in the first inorganic barrier layer 12 formed on the particle P, and the particle P is already present before the first inorganic barrier layer 12 is formed on the OLED 3. Alternatively, the particle P may be present on the first inorganic barrier layer 12. In this case, the organic barrier layer 14 is formed only at the border, namely, in a discontinuous portion, between the first inorganic barrier layer 12 and the particle P on the first inorganic barrier layer 12, and thus maintains the barrier property of the TFE structure 10A like in the above-described case. The organic barrier layer 14 may also be formed with a small thickness on the surface of the first inorganic barrier layer 12a on the particle P, or on the surface of the particle P. In this specification, the expression that "the organic barrier layer 14 is present around the particle P" encompasses all these forms.

The organic barrier layer (solid portion) 14 is not limited to being formed as in the example of FIG. 5(a), and may be formed only around the protruding portion of the surface of the first inorganic barrier layer 12 for substantially the same reason. Examples of the other regions where the organic barrier layer (solid portion) 14 may be formed will be described below.

Now, with reference to FIG. 5(b), a structure of the TFE structure 10A on the lead wires 30 will be described. FIG. 5(b) is a cross-sectional view taken along line 5B-5B' in FIG. 2; more specifically, is a cross-sectional view of portions 32, of the lead wires 30, close to the active region R1.

As shown in FIG. 5(b), the organic barrier layer (solid portions) 14 includes portions 14c formed around the protruding portions of the surface of the first inorganic barrier layer 12. The protruding portions reflect the cross-sectional shape of the portions 32 of the lead wires 30.

The lead wires 30 are patterned by the same step as that of, for example, the gate bus lines or the source bus lines. Thus, in this example, the gate bus lines and the source bus lines formed in the active region R1 also have the same cross-sectional structure as that of the portion 32, of each of the lead wires 30, close to the active region R1 shown in FIG. 5(b). It should be noted that typically, a flattening layer is formed on the gate bus lines and the source bus lines formed in the active region R1, and thus no stepped portion is formed at the surface of the first inorganic barrier layer 12 on the gate bus lines and the source bus lines.

The portion 32 of the lead wire 30 may have, for example, a forward tapering side surface portion (inclining side surface portion) having a tapering angle smaller than 90 degrees. In the case where the lead wire 30 includes the forward tapering side surface portion, formation of defects in the first inorganic barrier layer 12 and the second inorganic barrier layer 16 formed on the lead wire 30 is prevented. Namely, the moisture-resistance reliability of the TFE structure 10A is improved. The tapering angle of the forward tapering side surface portion is preferably smaller than, or equal to, 70 degrees.

The active region R1 of the OLED display device 100 is substantially covered with the inorganic barrier layer joint portion, in which the first inorganic barrier layer 12 and the second inorganic barrier layer 16 are in direct contact with each other, except for the regions where the organic barrier layer 14 is selectively formed. Therefore, it does not occur that the organic barrier layer 14 acts as a moisture entrance route to allow the moisture to reach the active region R1 of the OLED display device.

The OLED display device 100 according to an embodiment of the present invention is preferably usable for, for example, medium- to small-sized high-definition smartphones and tablet terminals. In a medium- to small-sized (e.g., 5.7-inch) high-definition (e.g., 500 ppi) OLED display device, it is preferred that lines (encompassing the gate bus lines and the source bus lines) in the active region R1 have a cross-sectional shape, taken in a direction parallel to a line width direction, close to a rectangle (side surfaces of the lines have a tapering angle of about 90 degrees) in order to allow the lines to have a sufficiently low resistance with a limited line width. In order to form the lines having a low resistance, the tapering angle of the forward tapering side surface portion TSF may be larger than 70 degrees and smaller than 90 degrees, or the tapering angle may be about 90 degrees in the entire length of the lines with no forward tapering side surface portion TSF being provided.

Now, FIG. 5(c) will be referred to. FIG. 5(c) is a cross-sectional view of a region where the TFE structure 10A is not formed. In this region, the terminals 38 have the same cross-sectional structure as that of portions 36 of the lead wires 30 shown in FIG. 5(c). The portions 36 of the lead wires 30 shown in FIG. 5(c) may have a tapering angle of, for example, about 90 degrees.

Figure 7:
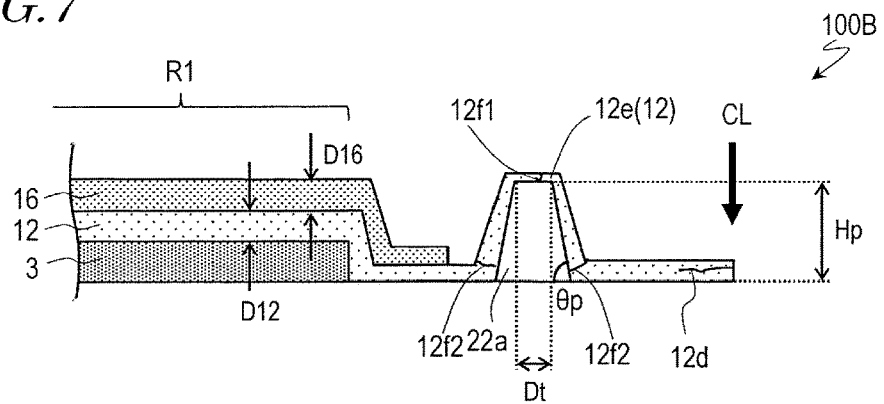
FIG. 7 is a cross-sectional view schematically showing a structure of another OLED display device 100B according to embodiment 1 of the present invention.

With reference to FIG. 7, a structure of another OLED display device 100B according to embodiment 1 of the present invention will be described. FIG. 7 is a schematic cross-sectional view of the OLED display device 100B.

As shown in FIG. 7, unlike in the OLED display device 100A, in the OLED display device 100B, the second inorganic barrier layer 16 is formed so as not to overlap the protruding structure 22a as seen in a direction normal to the substrate. An outer perimeter of the second inorganic barrier layer 16 is inner to the protruding structure 22a.

The OLED display device 100B having such a structure also provides substantially the same effects as those of the OLED display device 100A.

As described above, as long as the active region R1 is enclosed by the inorganic barrier layer joint portion, the first inorganic barrier layer 12 and the second inorganic barrier layer 16 may have any shape.

Hereinafter, modifications of the protruding structure will be described. OLEO display devices 100C through 100E described below as examples each have a feature in the protruding structure. The OLED display devices 100C through 100E are applicable to any of the above-described OLED display devices.

Figure 8:
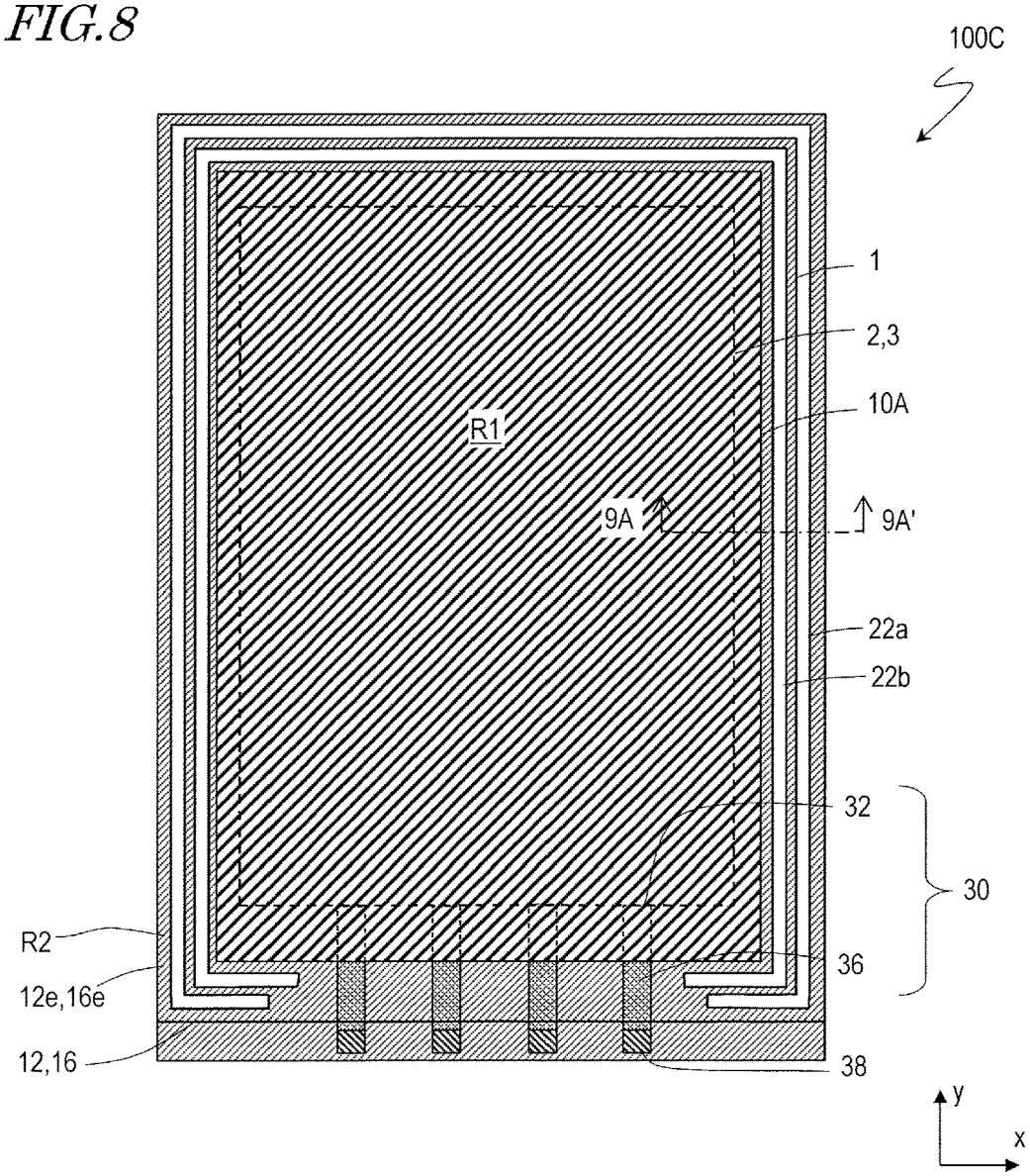
FIG. 8 is a plan view schematically showing a structure of still another OLED display device 100C according to embodiment 1 of the present invention.
Figure 9:
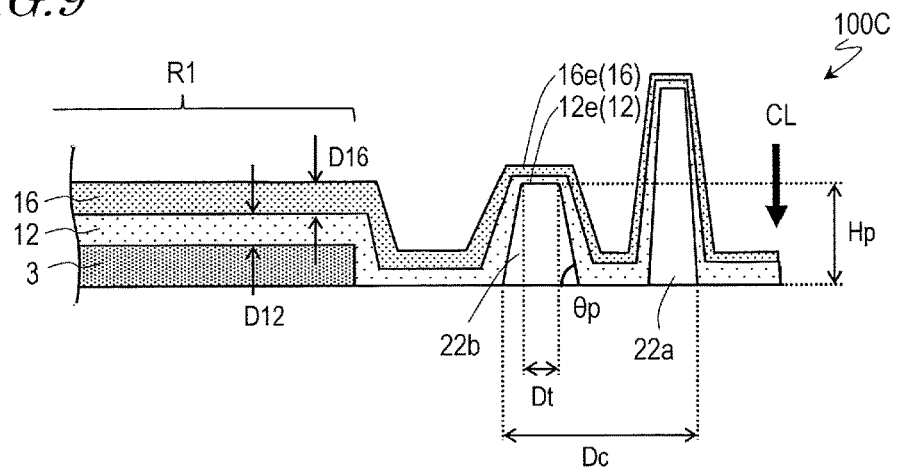
FIG. 9 is a schematic cross-sectional view of the OLED display device 100C taken along line 9A-9A' in FIG. 8.

With reference to FIG. 8 and FIG. 9, still another OLED display device 100C according to embodiment 1 of the present invention will be described. FIG. 8 is a schematic plan view of the OLED display device 100C, and FIG. 9 is a schematic cross-sectional view of the OLED display device 100C. FIG. 9 does not show the cracks or defects generated in the inorganic barrier layers, for the sake of simplicity.

As shown in FIG. 8 and FIG. 9, the OLED display device 100C is different from the OLED display device 100A in that the OLED display device 100C further includes a protruding structure 22b (may also be referred to as a "second protruding structure 22b") between the protruding structure 22a (may also be referred to as a "first protruding structure 22a") and the active region R1. The protruding structure 22b includes a portion extending along at least one side of the active region R1.

The OLED display device 100C includes the first protruding structure 22a and the second protruding structure 22b, and thus prevents a crack from reaching the active region R1 more effectively than the OLED display device 100A.

The first protruding structure 22a and the second protruding structure 22b each include a portion extending along three sides, among the four sides of the active region R1, other than the side along which the plurality of terminals are provided. Herein, the first protruding structure 22a and the second protruding structure 22b have portions extending generally parallel to each other.

A region where the first protruding structure 22a and the second protruding structure 22b are provided has a width Dc of, for example, about several hundred micrometers. Therefore, the provision of the first protruding structure 22a and the second protruding structure 22b does not significantly influence the reduction of the width of the frame portion of the OLED display device.

It is preferred that the first protruding structure 22a and the second protruding structure 22b each have a cross-sectional shape that satisfies the above-described conditions. The cross-sectional shape of the first protruding structure 22a and the cross-sectional shape of the second protruding structure 22b may be the same as, or different from, each other.

As shown in FIG. 9, the first protruding structure 22a, which is farther from the active region R1, may be higher than the second protruding structure 22b, which is closer to the active region R1. In this case, the first protruding structure 22a may also act as a spacer as described above.

The OLED display device in this embodiment may include three or more protruding structures, needless to say.

Figure 10:
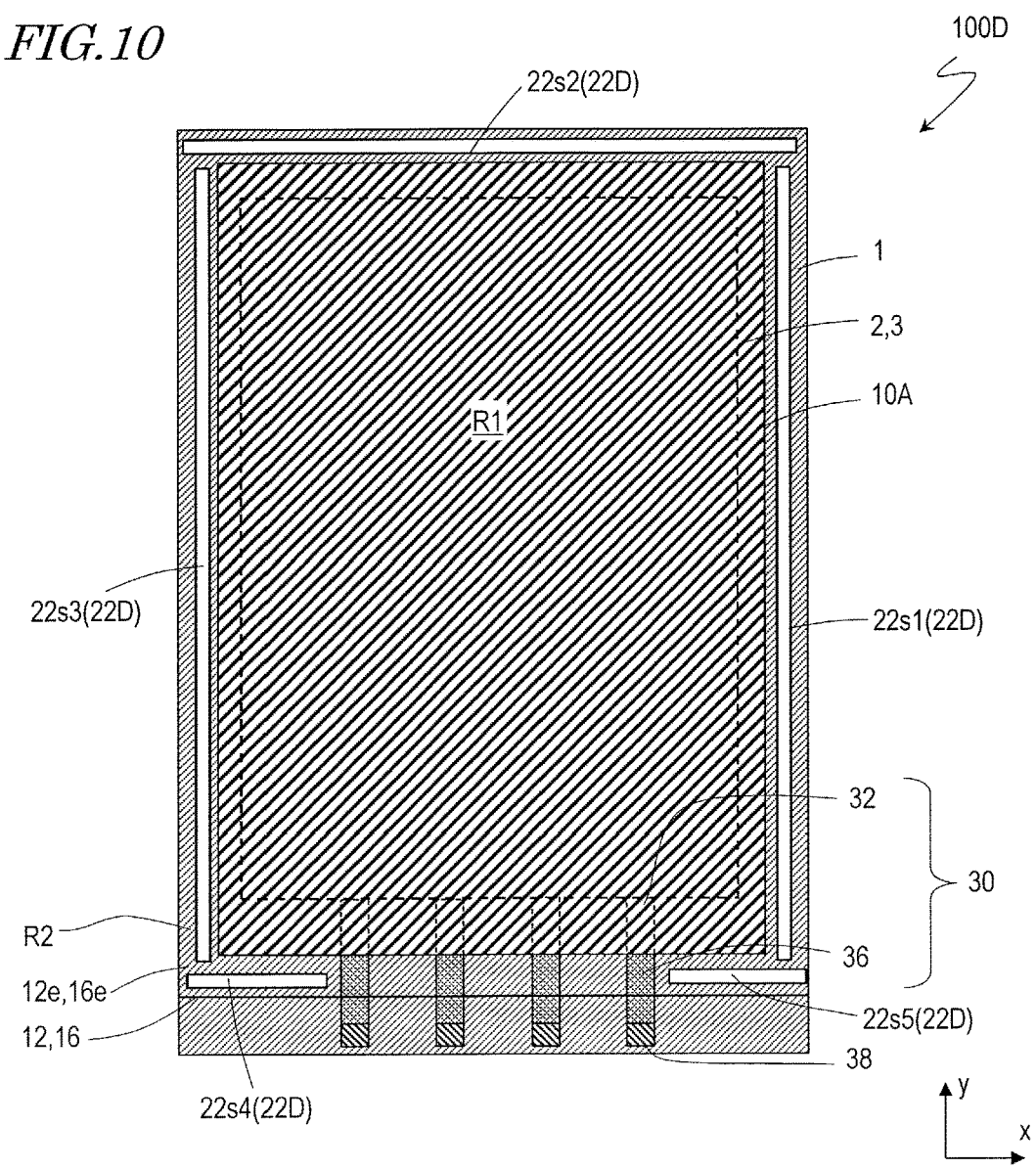
FIG. 10 is a plan view schematically showing a structure of still another OLED display device 100D according to embodiment 1 of the present invention.

With reference to FIG. 10, a structure of still another OLED display device 100D according to embodiment 1 of the present invention will be described. FIG. 10 is a schematic plan view of the OLED display device 100D.

As shown in FIG. 10, a protruding structure 22D included in the OLED display device 100D includes a plurality of sub structures $22s1$, $22s2$, $22s3$, $22s4$ and $22s5$. The plurality of sub structures $22s1$ through $22s5$ may collectively be referred to as the "protruding structure 22D". The protruding structure 22D includes the sub structures $22s1$ and $22s3$ respectively extending along y-axis-direction sides of the active region R1, the sub structure $22s2$ extending along a side, among the x-axis-direction sides of the active region R1, along which the plurality of terminals 38 or the plurality of lead wires 30 are not provided, and the sub structures $22s4$ and $22s5$ extending along a side, among the x-axis-direction sides of the active region R1, along which the plurality of terminals 38 and the plurality of lead wires 30 are provided.

Figure 11:
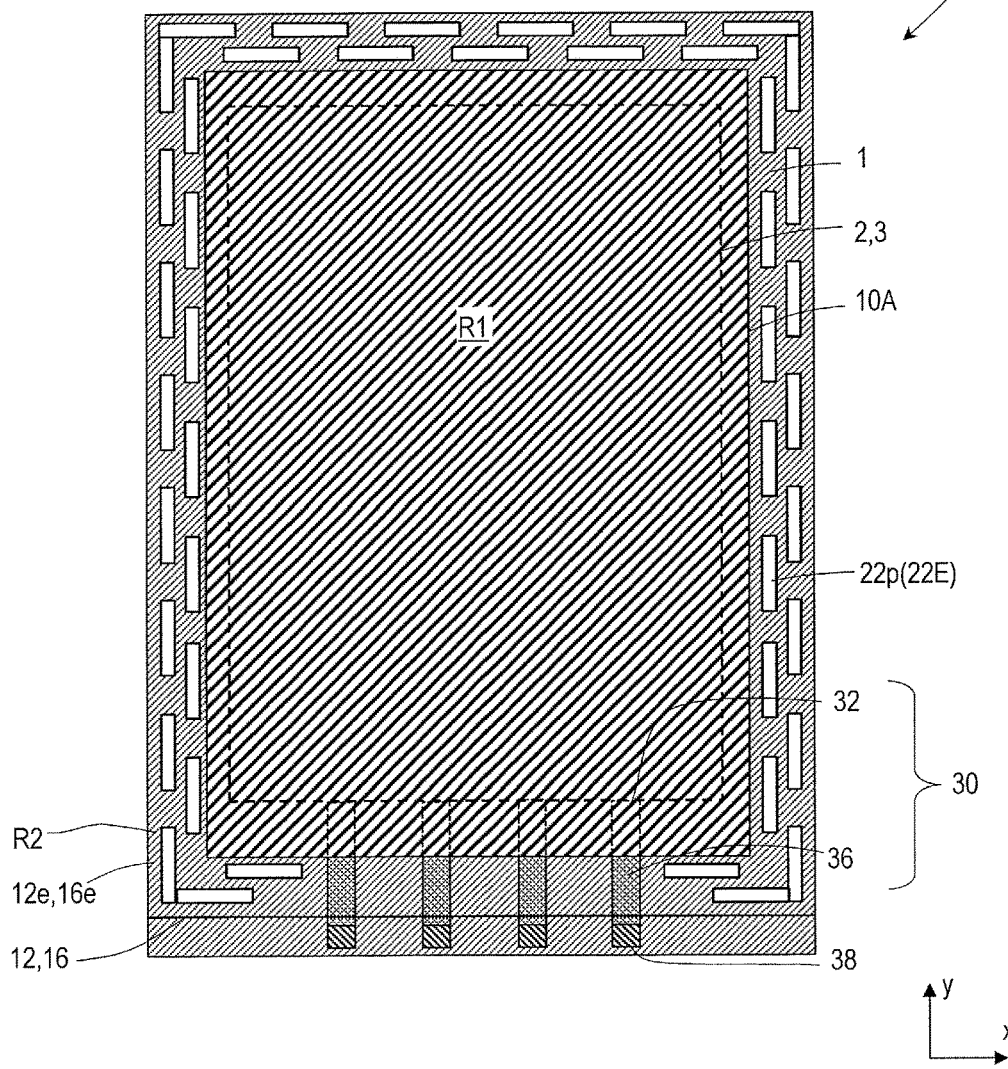
FIG. 11 is a plan view schematically showing a structure of still another OLED display device 100E according to embodiment 1 of the present invention.

With reference to FIG. 11, a structure of still another OLED display device 100E according to embodiment 1 of the present invention will be described. FIG. 11 is a schematic plan view of the OLED display device 100E.

As shown in FIG. 11, a protruding structure 22E included in the OLED display device 100E includes a plurality of sub structures 22p. The plurality of sub structures 22p may collectively be referred to as a "protruding structure 22E". The plurality of sub structures 22p are located in a region except for the region where the plurality of terminals 38 are provided, and are located so as to interrupt a line connecting the cutting line CL and the outer perimeter of the active region R1 to each other.

The plurality of sub structures 22p may each have any planar shape as seen in a direction normal to the substrate. Two or more sub structures 22p may be connected with each other. Top surfaces of the sub structures 22p may have substantially the same size as, or different sizes from, each other. In the case where the sub structures have the same planar shape and the same size as each other, there is an advantage that, for example, a photomask used to form the protruding structure 22E by a photolithography process may be simplified.

Embodiment 2

An OLED display device according to this embodiment is different from the OLED display device according to the above-described embodiment in the structure of the thin film encapsulation structure. The OLED display device according to this embodiment has a feature in the thin film encapsulation structure. The thin film encapsulation structure in this embodiment is applicable to any of the above-described OLED display devices.

Figure 12:
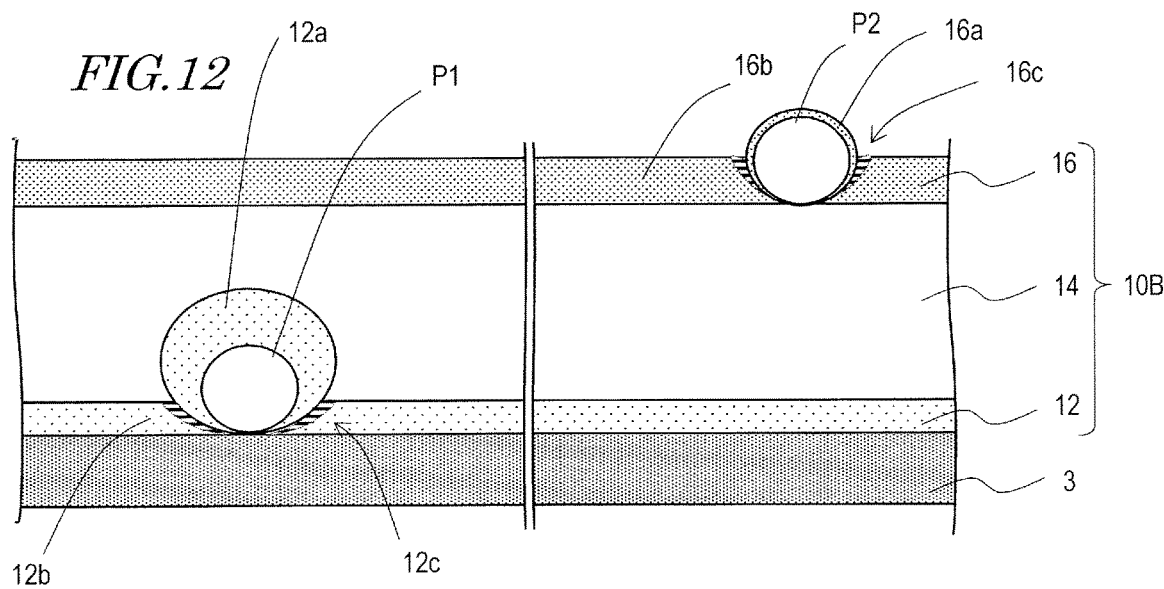
FIG. 12 is a cross-sectional view schematically showing a thin film encapsulation structure 10B included in an OLED display device according to embodiment 2 of the present invention.

FIG. 12 is a cross-sectional view schematically showing a TFE structure 10B included in an OLED display device according to embodiment 2 of the present invention. In the above-described embodiment, the organic barrier layer 14 included in the TFE structure 10A includes a plurality of solid portions distributed discretely. As shown in FIG. 12, the TFE structure 10B included in the OLED display device according to this embodiment includes a relatively thick organic barrier layer 14 (e.g., an organic barrier layer having a thickness exceeding about 5 μm and about 20 μm or less). The relatively thick organic barrier layer 14 is formed so as to cover, for example, the active region of each of the OLED display device portions formed on the element substrate.

In FIG. 12, P1 represents a particle already present before the first inorganic barrier layer 12 or the second inorganic barrier layer 16 is formed, and P2 represents a particle formed during the formation of the first inorganic barrier layer 12 or the second inorganic barrier layer 16.

When the first inorganic barrier layer 12 is formed on the particle P1 already present before the first inorganic barrier layer 12 is formed, the portion 12a growing from a surface of the particle P1 and the portion 12b growing from the flat portion of the OLED 3 impinge on each other, and as a result, the defect 12c is formed. Similarly, when the particle P2 is generated during the formation of the second inorganic barrier layer 16, a defect (e.g., crack) 16c is formed in the second inorganic barrier layer 16. The particle P2 is generated during the formation of the second inorganic barrier layer 16, and thus a portion 16a, of the second inorganic barrier layer 16, that is formed on the particle P2 is shown as being thinner than a portion 16b formed on the flat portion.

Such a relatively thick organic barrier layer 14 may be formed by, for example, inkjet printing. In the case where a printing method such as inkjet printing or the like is used to form an organic barrier layer, the organic barrier layer may be adjusted to be formed only in the active region on the element substrate but not to be formed in a region overlapping the protruding structure.

INDUSTRIAL APPLICABILITY

Embodiments of the present invention are applicable to an organic EL display device, especially, a flexible organic EL display device, and a method for producing the same.

REFERENCE SIGNS LIST 1 substrate (flexible substrate)
2 back plane (circuit)
3 organic EL element
4 polarizing plate
10, 10A, 10B thin film encapsulation structure (TFE structure)
12 first inorganic barrier layer
14 organic barrier layer
16 second inorganic barrier layer
22a, 22b, 22D, 22E protruding structure
30 lead wire
38 terminal
100, 100A, 100B, 100C, 100D, 100E organic EL display device
200A mother panel

The invention claimed is:

1. An organic electro-luminescence (EL) device including an active region that includes a plurality of organic EL elements and also including a peripheral region located in a region other than the active region, the organic EL device comprising:
   an element substrate including a substrate, and the plurality of organic EL elements supported by the substrate; and
   a thin film encapsulation structure covering the plurality of organic EL elements,
   wherein the thin film encapsulation structure includes a first inorganic barrier layer, an organic barrier layer in contact with a top surface of the first inorganic barrier layer, and a second inorganic barrier layer in contact with the top surface of the first inorganic barrier layer and a top surface of the organic barrier layer,
   wherein the peripheral region includes a first protruding structure supported by the substrate, the first protruding structure including a portion extending along at least one side of the active region, and also includes an extending portion, of the first inorganic barrier layer, extending onto the first protruding structure, the first protruding structure having a height larger than a thickness of the first inorganic barrier layer,
   wherein the second inorganic barrier layer does not overlap the first protruding structure as seen in a direction normal to the substrate,
   wherein the element substrate includes a plurality of gate bus lines each connected with any of the plurality of organic EL elements, and a plurality of source bus lines each connected with any of the plurality of organic EL elements,
   wherein the peripheral region includes a plurality of terminals provided adjacent to a certain side of the active region, and a plurality of lead wires connecting each of the plurality of terminals and either one of the plurality of gate bus lines or either one of the plurality of source bus lines to each other, and wherein the first protruding structure does not include any portion that overlaps the plurality of lead wires as seen in a direction normal to the substrate.

2. The organic EL device of claim 1, wherein the first protruding structure includes a top portion having a width of 10 μm or shorter in a cross-section perpendicular to a direction in which the first protruding structure extends.

3. The organic EL device of claim 1, wherein the first protruding structure has a side surface having a tapering angle of 80 degrees or larger in a cross-section perpendicular to a direction in which the first protruding structure extends.

4. The organic EL device of claim 1, wherein the first protruding structure includes a top portion having a width that is less than a half of a sum of the thickness of the first inorganic barrier layer and a thickness of the second inorganic barrier layer in a cross-section perpendicular to a direction in which the first protruding structure extends.

5. The organic EL device of claim 1, wherein the first protruding structure includes a portion extending along three sides of the active region.

6. The organic EL device of claim 1,
wherein the first protruding structure includes a portion extending along three sides of the active region other than the certain side.

7. The organic EL device of claim 1,
wherein the organic barrier layer includes a plurality of solid portions distributed discretely, and
wherein the second inorganic barrier layer is in contact with the top surface of the first inorganic barrier layer and top surfaces of the plurality of solid portions of the organic barrier layer.

8. The organic EL device of claim 1, wherein the peripheral region includes a second protruding structure between the active region and the first protruding structure, the second protruding structure extending along at least one side of the active region.

9. The organic EL device of claim 1, wherein the first protruding structure includes a plurality of sub structures.

10. A method for producing the organic EL device of claim 1,
wherein a step of preparing the element substrate includes step a1 of forming the first protruding structure on the substrate, and
wherein a step of forming the thin film encapsulation structure includes:
step A of forming the first inorganic barrier layer on the first protruding structure so as to cover the first protruding structure, the first inorganic barrier layer having a thickness smaller than a height of the first protruding structure,
step B of, after the step A, forming the organic barrier layer on the first inorganic barrier layer, and
step C of, after the step B, forming the second inorganic barrier layer on the first inorganic barrier layer and the organic barrier layer.

11. The method for producing the organic EL device of claim 10,
wherein the step of preparing the element substrate further includes step a2 of forming a bank layer defining each of a plurality of pixels each including either one of the plurality of organic EL elements, and
wherein the step a1 and the step a2 are performed by patterning a same resin film.

12. The organic EL device of claim 1,
wherein the peripheral region includes a joint region located between the active region and the first protruding structure, the joint region enclosing the active region, and
wherein the joint region has a layered structure in which the substrate and the first inorganic barrier layer are in direct contact with each other and the first inorganic barrier layer and the second inorganic barrier layer are in direct contact with each other.

* * * * *